United States Patent
Nishiwaki

(10) Patent No.: US 8,076,745 B2
(45) Date of Patent: Dec. 13, 2011

(54) IMAGING PHOTODETECTION DEVICE

(75) Inventor: Seiji Nishiwaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 218 days.

(21) Appl. No.: 12/440,195

(22) PCT Filed: Jul. 22, 2008

(86) PCT No.: PCT/JP2008/001952
§ 371 (c)(1),
(2), (4) Date: Mar. 5, 2009

(87) PCT Pub. No.: WO2009/019818
PCT Pub. Date: Feb. 12, 2009

(65) Prior Publication Data
US 2010/0176473 A1    Jul. 15, 2010

(30) Foreign Application Priority Data

Aug. 6, 2007  (JP) .................................. 2007-204394

(51) Int. Cl.
H01L 31/0203    (2006.01)
(52) U.S. Cl. ......... 257/434; 257/435; 257/443; 257/433
(58) Field of Classification Search .................. 257/432, 257/433, 434, 435, 443, E31.127
See application file for complete search history.

(56) References Cited

U.S. PATENT DOCUMENTS

| 4,255,019 A | 3/1981 | Knop |
| 2003/0156210 A1 | 8/2003 | Wako et al. |

2007/0045685 A1 *    3/2007  Yang et al. .................... 257/294

FOREIGN PATENT DOCUMENTS

| JP | 4-145662 | 5/1992 |
| JP | 10-163465 | 6/1998 |
| JP | 99/39372 | 8/1999 |
| JP | 2002-502120 | 1/2002 |
| JP | 2005-167356 | 6/2005 |

* cited by examiner

*Primary Examiner* — Matthew Reames
(74) *Attorney, Agent, or Firm* — Hamre, Schumann, Mueller & Larson, P.C.

(57) ABSTRACT

An imaging photodetection device includes a plurality of photodetectors (6) arrayed on a substrate (5) one-dimensionally or two-dimensionally, a low refractive index transparent layer (12) formed above the plural photodetectors, and a plurality of columnar or plate-like high refractive index transparent sections (13) embedded in the low refractive index transparent layer along the array direction of the plural photodetectors. At least two of the photodetectors correspond to one of the high refractive index transparent sections. Light entering the low refractive index transparent layer and the high refractive index transparent sections passes therethrough to be separated into a $0^{th}$-order diffracted light, a $1^{st}$-order diffracted light and a $-1^{st}$-order diffracted light by a phase shift occurring on the wavefront. Thereby, improvement in the efficiency for light utilization and pixel densification can be realized.

18 Claims, 13 Drawing Sheets

IMAGING PHOTODETECTION DEVICE

TECHNICAL FIELD

The present invention relates to an imaging photodetection device used for picking up an image of an object.

BACKGROUND ART

Conventional imaging photodetection devices are disclosed for example by Non-patent document 1 and Non-patent document 2. The imaging photodetection devices disclosed thereby will be described below in brief.

FIG. 9A is a side view showing a schematic configuration of a conventional imaging device. A light beam such as natural light enters an object 1, and the light beam reflected thereby forms an image 3 on a photodetection device 4 such as CCD or CMOS by a lens system 2. Though the lens system 2 is composed typically by combining a plurality of lenses aligned along an optical axis in order to ensure the optical performance, the lens system 2 is shown schematically as a single lens in FIG. 9A.

FIG. 9B is a view showing a schematic configuration of the photodetection device 4, and it is a magnified cross-sectional view of a portion 9B in FIG. 9A. A low refractive index transparent buffer layer 7 made of $SiO_2$ or the like, a high refractive index transparent buffer layer 8 made of SiN or the like, a plurality of color filters 9 and a plurality of microlenses 10 are laminated in this order on a detection substrate 5 where a plurality of photodetectors 6 have been formed. An uneven structure is provided on a surface 7a of the transparent buffer layer 7 in contact with the transparent buffer layer 8 so that the thickness of the transparent buffer layer 7 is decreased at each of the photodetectors 6. In contrast, a surface 8a of the transparent buffer layer 8 in contact with the color filters 9 is shaped flat.

The microlenses 10 are arranged at the respective intersections of an orthogonal grid, and one color filter 9 and one photodetector 6 are arranged on the central axis of each microlens 10.

The microlenses 10 function for refracting light such as a light beam 11a' that enters with a shift relative to the central axis of the microlens 10 and guiding the light to the photodetector 6. The uneven structure on the surface 7a of the transparent buffer layer 7 also has a lens effect, thereby refracting a divergent light beam 11b' that travels in a direction away from the center of the photodetector 6 and guiding it to the photodetector 6.

The color filters 9 are composed of three kinds of filters, namely, a red transmission filter 9R, a green transmission filter 9G and a blue transmission filter 9B. The red transmission filter 9R has a light transmission characteristic (spectral sensitivity characteristic) of cutting (absorbing) light of wavelength other than red, as illustrated with a curve R in FIG. 10; the green transmission filter 9G has a light transmission characteristic (spectral sensitivity characteristic) of cutting (absorbing) light of wavelength other than green, as illustrated with a curve G in FIG. 10; and the blue transmission filter 9B has a light transmission characteristic (spectral sensitivity characteristic) of cutting (absorbing) light of wavelength other than blue, as illustrated with a curve B in FIG. 10 (see Non-patent document 2). One pixel for detecting color image information is configured with four color filters 9 composed of the red transmission filter 9R, the green transmission filter 9G, the blue transmission filter 9B, and a green transmission filter 9G for brightness detection, and also four photodetectors 6 corresponding to the color filters 9.

FIG. 11 is a magnified plan view of a detection plane of the optical detection device 4. The photodetectors 6 are arranged at the intersections of the orthogonal grid in a state spaced and insulated from each other. Between the photodetectors 6 adjacent horizontally to each other, a plurality of vertical transfer CCDs 17 as signal wirings extending vertically are provided, and the plural vertical transfer CCDs 17 are connected to a horizontal transfer CCD 18 as a signal wiring extending horizontally. Light focused by the microlens 10 is received by the photodetector 6 located just under the microlens 10, and photoelectrically converted. Electric charge stored in the photodetector 6 is sent to the vertical transfer CCDs 17 and further sent to the horizontal transfer CCD 18 so as to be outputted as an image signal.

In the photodetection device 4 as shown in FIG. 9B, the color filters 9 are used to let light of a specific color enter each of the photodetectors 6. On the other hand, a photodetection device as shown in FIG. 12 is suggested, which uses a microprism 31 in order to disperse a light beam 30 coming from a photographic subject and passing through a microlens (not shown), and detects the light beams of respective colors of red (R), green (G) and blue (B) with photodetectors 32R, 32G and 32B (see Patent document 1).

Non-patent document 1: 'Optical and Electro-Optical Engineering Contact', vol. 40, No. 1 (2002), p. 24
Non-patent document 2: 'Transistor Gijutsu', February 2003, p. 128
Patent document 1: JP 2002-502120 A

DISCLOSURE OF INVENTION

Problem to be Solved by the Invention

Demands for miniaturization and an increased number of pixels have increased regarding imaging photodetection devices. However, there is a limitation for the above-mentioned conventional imaging photodetection devices to satisfy the demands due to the reasons below.

The first reason is that color separation is carried out by using the color filters 9 in the conventional imaging photodetection device as shown in FIG. 9B. For example, since the light of wavelength other than blue is absorbed by the blue transmission filter 9B, as clearly shown in FIG. 10, only about 20 to 30% of incident light passes through the blue transmission filter 9B. The same can be said of the other color filters 9R and 9G. When the spacing between the photodetectors 6 is decreased for increasing the number of pixels, the sizes of the photodetectors 6 and the microlenses 10 are decreased. Thereby, the quantity of light entering one microlens 10 is reduced, furthermore most of the light is absorbed by the color filters 9, and thus a sufficient quantity of light cannot be fed to the photodetectors 6. As a result, a detection signal will be hidden among noise signals such as an optical shot noise. Therefore, in a conventional imaging photodetection device, it is held that the lower limit for the spacing between the photodetectors 6 is about 1.5 μm.

The second reason is that microlenses 10 are arranged in a one-to-one correspondence with the photodetectors 6 in the conventional imaging photodetection device as shown in FIG. 9B. When the spacing between the photodetectors 6 is decreased for increasing the number of pixels, the size of the microlenses 6 is decreased, and thus the size of the light flux passing through the microlens 10 is decreased. Just like the flare angle of light passing through a pinhole is inversely proportional to the pinhole diameter, the characteristic that the light is diffused (diffracted) is enhanced excessively when the size of the light flux (i.e., the diameter of the microlens) is decreased considerably, and thus it is difficult to obtain desired focusing performance by using the microlens 10. For the purpose of obtaining the focusing performance of the microlens 10, the microlens 10 is required to have a diameter at least twice or triple the wavelength. This has been an obstacle in increasing the number of pixels.

In the conventional photodetection device as shown in FIG. 12, the efficiency for light utilization is improved since a color filter that absorbs light is not used. However, the spectral action (difference in the refractive angle by wavelength) utilizing the dispersion characteristic of a prism is extremely small, and a displacement between red light and green light or a displacement between green light and blue light is extremely small. Therefore, in a case of using a prism for separating light into its spectral components, it is required to set the spacing between the prism and the photodetection plane to be at least tens to hundreds of micrometers or more, which is not a practical dimension in a trial production.

Therefore, with the foregoing in mind, it is an object of the present invention to solve the above-mentioned problems in the prior art, decrease drastically the spacing between photodetectors by improving the efficiency for light utilization, and realize both the establishment of the size required for microlenses and an increase in the density of pixels. Another object of the present invention is to realize a practically dimensioned photodetection device by utilizing a large spectral action.

Means for Solving Problem

An imaging photodetection device of the present invention includes a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors. At least two of the photodetectors correspond to one of the high refractive index transparent sections. Light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront.

Effects of the Invention

As the imaging photodetection device of the present invention carries out color separation of light not through optical absorption but through optical diffraction, the efficiency for light utilization is improved drastically. Moreover, two kinds of color information can be detected per microlens. Therefore, the size of the microlenses can be ensured and at the same time, the density of pixels can be increased. Further, since spectra are obtained by utilizing the difference in the diffractive angle by wavelength, the spacing between a high refractive index transparent section and a photodetector can be decreased to realize a practical dimension.

DESCRIPTION OF THE INVENTION

Figure 1A:
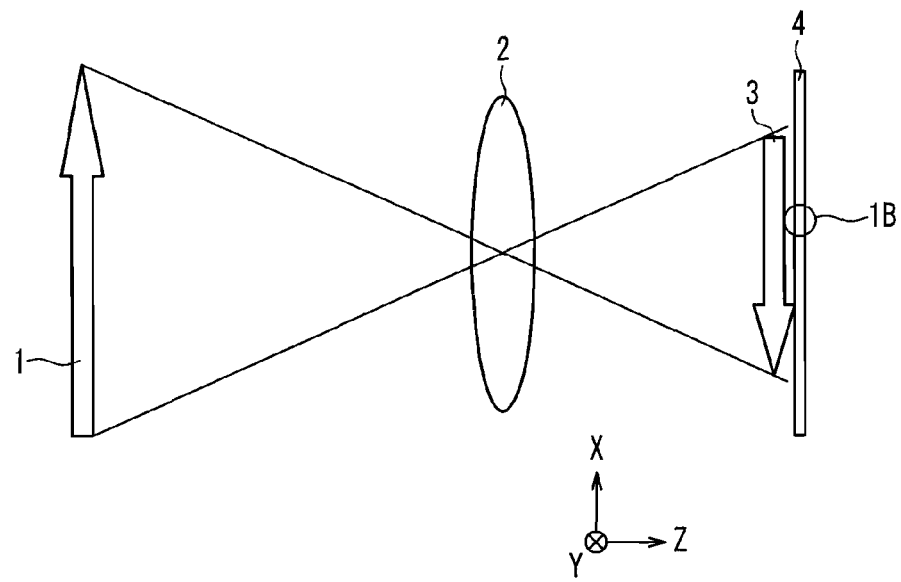
FIG. 1A is a side view showing a schematic configuration of an imaging photodetection device according to an embodiment of the present invention.

In the above-mentioned imaging photodetection device of the present invention, it is preferable that the $0^{th}$-order diffracted light, the $1^{st}$-order diffracted light and $-1^{st}$-order diffracted light are detected by photodetectors different from each other. Thereby, it is possible to detect light beams of different wavelengths respectively by different photodetectors.

It is also preferable that the plural high refractive index transparent sections comprise a red-specification high refractive index transparent section, a green-specification high refractive index transparent section and a blue-specification high refractive index transparent section, which are different from each other in at least one of the refractive index, the shape and the size. In this case, it is preferable that the phase shift occurring between light passing through the high refractive index transparent sections and light passing through the low refractive index transparent layer is: $(a+\frac{1}{2})$ times a red wavelength for the case of the red-specification high refractive index transparent section, $(b+\frac{1}{2})$ times a green wavelength for the case of the green-specification high refractive index transparent section, and $(c+\frac{1}{2})$ times a blue wavelength for the case of the blue-specification high refractive index transparent section, where a, b and c are zero or integers greater than zero. Thereby, it is possible to generate diffracted light and transmitted light in a desired wavelength range. The values of a, b and c can be equal to or different from each other.

Here, it is preferable that a, b and c are zero or 1. As a result of applying small values to a, b and c, the length in the thickness direction of the high refractive index transparent section can be decreased, and thus the optical loss can be reduced and the production becomes easier.

It is also preferable that the plural high refractive index transparent sections comprise a red-specification high refractive index transparent section, a green-specification high refractive index transparent section and a blue-specification high refractive index transparent section. In this case, it is preferable that a length h in the thickness direction of the high refractive index transparent sections satisfies: $h=\text{'red wavelength'}*(2*a+1)/\{2*(n-n_0)\}$ at the red-specification high refractive index transparent section; $h=\text{'green wavelength'}*(2*b+1)/\{2*(n-n_0)\}$ at the green-specification high refractive index transparent section; and $h=\text{'blue wavelength'}*(2*c+1)/\{2*(n-n_0)\}$ at the blue-specification high refractive index transparent section, where a, b, c are zero or integers greater than zero, and n, $n_0$ denote respectively refractive indices of the high refractive index transparent sections and the low refractive index transparent layer. Thereby, it is possible to generate diffracted light and transmitted light in a desired wavelength range. The values of a, b and c can be equal to or different from each other.

Here, it is preferable that a, b and c are zero or 1. As a result of applying small values to a, b and c, the length h in the thickness direction of the high refractive index transparent section can be decreased, and thus the optical loss can be reduced and the production becomes easier.

It is also preferable that the plural high refractive index transparent sections comprise a first specification high refractive index transparent section corresponding to a first wavelength and a second specification high refractive index transparent section corresponding to a second wavelength, which are different from each other in at least one of the refractive index, the shape and the size. In this case, it is preferable that the phase shift occurring between light passing through the high refractive index transparent sections and light passing through the low refractive index transparent layer is: $(a+\frac{1}{2})$ times the first wavelength for the case of the first specification high refractive index transparent section and $(b+\frac{1}{2})$ times the second wavelength for the case of the second specification high refractive index transparent section, where a and b are zero or integers greater than zero. Thereby, it is possible to generate diffracted light and transmitted light in a desired wavelength range. The values of a and b can be equal to or different from each other.

Here, it is preferable that a and b are zero or 1. As a result of applying small values to a and b, the length in the thickness direction of the high refractive index transparent section can be decreased, and thus the optical loss can be reduced and the production becomes easier.

It is also preferable that the plural high refractive index transparent sections comprise a first specification high refractive index transparent section corresponding to a first wavelength and a second specification high refractive index transparent section corresponding to a second wavelength. In this case, it is preferable that a length h in the thickness direction of the high refractive index transparent sections satisfies: $h=\text{'first wavelength'}*(2*a+1)/\{2*(n-n_0)\}$ at the first specification high refractive index transparent section; and $h=\text{'second wavelength'}*(2*b+1)/\{2*(n-n_0)\}$ at the second specification high refractive index transparent section, where a and b are zero or integers greater than zero, and n, $n_0$ denote respectively refractive indices of the high refractive index transparent sections and the low refractive index transparent layer. Thereby, it is possible to generate diffracted light and transmitted light in a desired wavelength range. The values of a and b can be equal to or different from each other.

Here, it is preferable that the values of a and b are zero or 1. As a result of applying small values to a and b, the length h in the thickness direction of the high refractive index transparent section can be decreased, and thus the optical loss can be reduced and the production becomes easier.

It is also preferable that the plural high refractive index transparent sections comprise a red-specification high refractive index transparent section, a green-specification high refractive index transparent section and a blue-specification high refractive index transparent section. In this case, it is preferable that in a first direction parallel to a crossed line between a plane including the $0^{th}$-order diffracted light, the $1^{st}$-order diffracted light and the $-1^{st}$-order diffracted light and a surface of the substrate, a sequence of the red-specification high refractive index transparent section, the green-specification high refractive index transparent section and the blue-specification high refractive index transparent section, or a sequence of the red-specification high refractive index transparent section, the blue-specification high refractive index transparent section and the green-specification high refractive index transparent section is arranged repeatedly. It is further preferable that three of the photodetectors corresponding to each of the plural high refractive index transparent sections are arranged along the first direction, and among the three photodetectors arranged along the first direction, two of the photodetectors positioned on both outsides also correspond to two of the high refractive index transparent sections that are adjacent in the first direction to the high refractive index transparent section corresponding to the three photodetectors. Thereby, color separation and the detection of complementary colors of three colors become possible.

Here, it is preferable that the positions in the first direction of the red-specification high refractive index transparent section, the green-specification high refractive index transparent section and the blue-specification high refractive index transparent section in the array of the plural high refractive index transparent sections arranged along the first direction are shifted by an arrangement pitch in the first direction between two of the arrays adjacent to each other in a second direction orthogonal to the first direction. Thereby, it is possible to suppress the occurrence of moiré.

It is also preferable that the plural high refractive index transparent sections comprise a red-specification high refractive index transparent section, a green-specification high refractive index transparent section and a blue-specification high refractive index transparent section. Here it is preferable that in a first direction parallel to a crossed line between a plane including the $0^{th}$-order diffracted light, the $1^{st}$-order diffracted light and the $-1^{st}$-order diffracted light and a surface of the substrate, two of the red-specification high refractive index transparent section, the green-specification high refractive index transparent section and the blue-specification high refractive index transparent section are arranged alternately. It is further preferable that three of the photodetectors corresponding to each of the plural high refractive index transparent sections are arranged along the first direction, and among the three photodetectors arranged along the first direction, two of the photodetectors positioned on both outsides also correspond to two of the high refractive index transparent sections that are adjacent in the first direction to the high refractive index transparent section corresponding to the three photodetectors. Thereby, color separation and detection of complementary colors of three colors become possible.

It is also preferable that the positions in a first direction of the high refractive index transparent sections in the arrays of the high refractive index transparent sections arranged along the first direction are shifted by the half of an arrangement pitch in the first direction between two arrays adjacent to each other in a second direction orthogonal to the first direction, the first direction being parallel to a crossed line between a plane including the $0^{th}$-order diffracted light, the $1^{st}$-order diffracted light and the $-1^{st}$-order diffracted light and a surface of the substrate. Thereby, it is possible to improve further the efficiency for utilization of light from a photographic subject.

Hereinafter, embodiments of the present invention will be described with reference to attached drawings. In the drawings, components common to those of conventional examples are assigned with the identical reference numerals.

FIG. 1A is a side view showing a schematic configuration of an imaging device according to an embodiment of the present invention. A light beam such as natural light enters an object 1, and the light beam reflected thereby forms an image 3 on a photodetection device 4 such as CCD or CMOS by a lens system 2. Though the lens system 2 is composed typically by combining a plurality of lenses aligned along an optical axis in order to ensure the optical performance, the lens system 2 is shown as a single lens schematically in FIG. 1A. For convenience of the explanation below, an XYZ rectangular coordinate system is set, where Z axis is a normal axis of a photodetection plane of the photodetection device 4 (or surface of a below-mentioned substrate 5), X axis is a vertical axis parallel to the photodetection plane, and Y axis is a horizontal axis parallel to the photodetection plane.

Figure 1B:
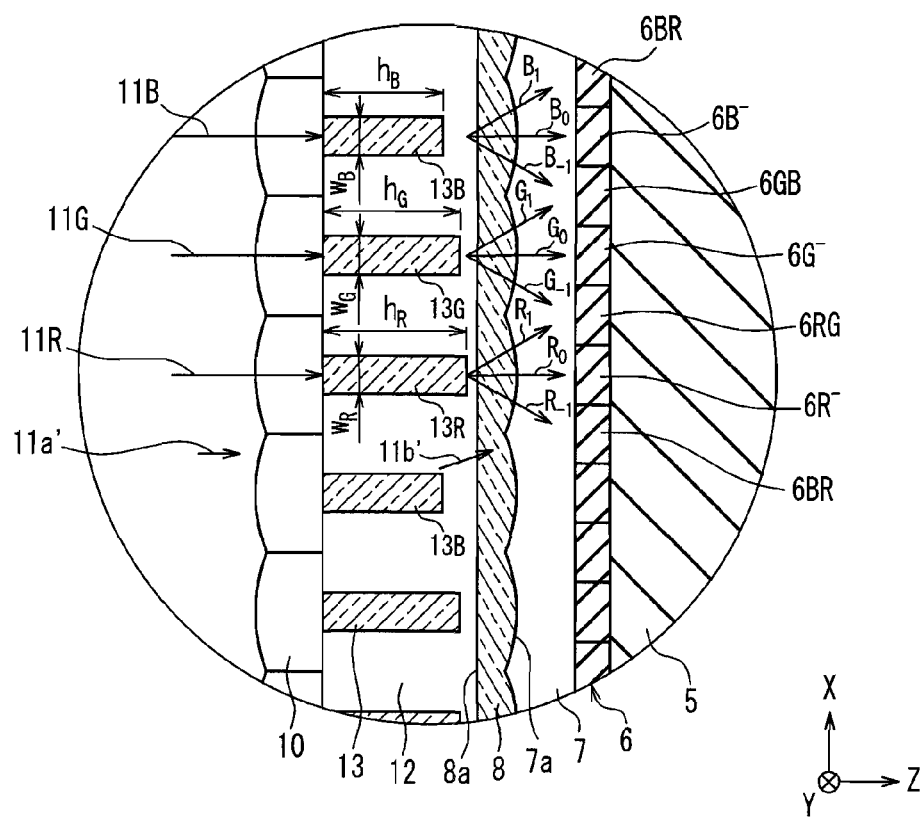
FIG. 1B is a magnified cross-sectional view of the portion 1B in FIG. 1A, showing a schematic configuration of an imaging photodetection device according to an embodiment of the present invention.

FIG. 1B is a view showing the schematic configuration of the photodetection device 4, and it is a magnified cross-sectional view of a portion 1B in FIG. 1A. A low refractive index transparent buffer layer 7 made of $SiO_2$ or the like, a high refractive index transparent buffer layer 8 made of SiN or the like, a low refractive index transparent layer 12 made of $SiO_2$ or the like and a plurality of microlenses 10 are laminated in this order on a detection substrate 5 where a plurality of photodetectors 6 have been formed. In the low refractive index transparent layer 12, a plurality of high refractive index transparent sections 13 made of SiN or the like are embedded. An uneven structure is provided on a surface 7a of the transparent buffer layer 7 in contact with the transparent buffer 8 so that the thickness of the transparent buffer layer 7 is decreased on the central axis of each of the microlenses 10. In contrast, a surface 8a of the transparent buffer layer 8 in contact with the low refractive index transparent layer 12 is shaped flat.

The microlenses 10 are arranged on the respective intersections of an orthogonal grid formed by a plurality of straight lines parallel to the X-axis direction and a plurality of straight lines parallel to the Y-axis direction. The high refractive index transparent sections 13 are in a one-to-one correspondence with the microlenses 10, and one high refractive index transparent section 13 is arranged on the central axis of each microlens 10. Similarly, the photodetectors 6 are arranged on the respective intersections of an orthogonal grid formed by a plurality of straight lines parallel to the X-axis direction and a plurality of straight lines parallel to the Y-axis direction. The central axes of the respective microlenses 10 adjacent to each other in the X-axis direction (vertical direction on the surface of FIG. 1B) pass through the centers of every other photodetector 6. The central axes of the respective microlenses 10 adjacent to each other in the Y-axis direction (direction perpendicular to the surface of FIG. 1B) pass through the centers of the photodetectors 6 adjacent to each other (see FIG. 5 described below).

The microlens 10 functions for refracting light such as a light beam $11a'$ that enters with a shift relative to the central axis of the microlens 10 and for guiding the light to the photodetector 6. The uneven structure on the surface 7a of the transparent buffer layer 7 also has a lens effect, thereby refracting a divergent light beam $11b'$ that travels in a direction away from the center of the photodetector 6 and guiding it to the photodetector 6. Furthermore, the high refractive index transparent sections 13 function as a waveguide. Therefore, when light inclined with respect to the central axes of the microlenses 10 enters, the high refractive index transparent sections 13 function for correcting the propagation orientation of the light and guiding the light to the photodetectors 6.

The high refractive index transparent sections 13 are shaped as plates continuous in the Y-axis direction (direction perpendicular to the surface of FIG. 1B) or as columns separated in a one-to-one correspondence with the positions of the microlenses 10 arranged in the Y-axis direction. When the high refractive index transparent sections 13 are columnar, the dimension in the Y-axis direction is twice to triple or more the dimension in the X-axis direction. The high refractive index transparent sections 13 are composed of a red-specification high refractive index transparent section 13R, a green-specification high refractive index transparent section 13G and a blue-specification high refractive index transparent section 13B, which are different from each other in the width (dimension in the X-axis direction) w and the length (dimension in the thickness direction of the photodetector 4, i.e., dimension in the Z-axis direction) h, which are arranged in this order periodically and repeatedly in the X-axis direction. The red-specification high refractive index transparent section 13R has a width $w_R$ and a length $h_R$; the green-specification high refractive index transparent section 13G has a width $w_G$ and a length $h_G$; and the blue-specification high refractive index transparent section 13B has a width $w_B$ and a length $h_B$. A light beam 11R entering the red-specification high refractive index transparent section 13R is separated into a $0^{th}$-order diffracted light $R_0$, a $1^{st}$-order diffracted light $R_1$, and a $-1^{st}$-order diffracted light $R_{-1}$ in the vertical direction plane (XZ plane) at the time of exiting from the red-specification high refractive index transparent section 13R, and detected respectively by the photodetectors 6R⁻, 6RG and 6BR. A light beam 11G entering the green-specification high refractive index transparent section 13G is separated into a $0^{th}$-order diffracted light $G_0$, a $1^{st}$-order diffracted light $G_1$ and a $-1^{st}$-order diffracted light $G_{-1}$ in the vertical direction plane (XZ plane) at the time of exiting from the green-specification high refractive index transparent section 13G, and detected respectively by the photodetectors 6G⁻, 6GB and 6RG. A light beam 11B entering the blue-specification high refractive index transparent section 13B is separated into a $0^{th}$-order diffracted light $B_0$, a $1^{st}$-order diffracted light $B_1$, and a $-1^{st}$-order diffracted light $B_{-1}$ in the vertical direction plane (XZ plane) at the time of exiting from the blue-specification high refractive index transparent section 13B, and detected respectively by the photodetectors 6B⁻, 6BR and 6GB. In order to separate definitely the respective light distributions of the $0^{th}$-order diffracted light, the $1^{st}$-order diffracted light and the $-1^{st}$-order diffracted light, it is preferable that a spacing of at least 1 µm is provided between the tips of the high refractive index transparent sections 13 and the photodetectors 6.

Figure 2:
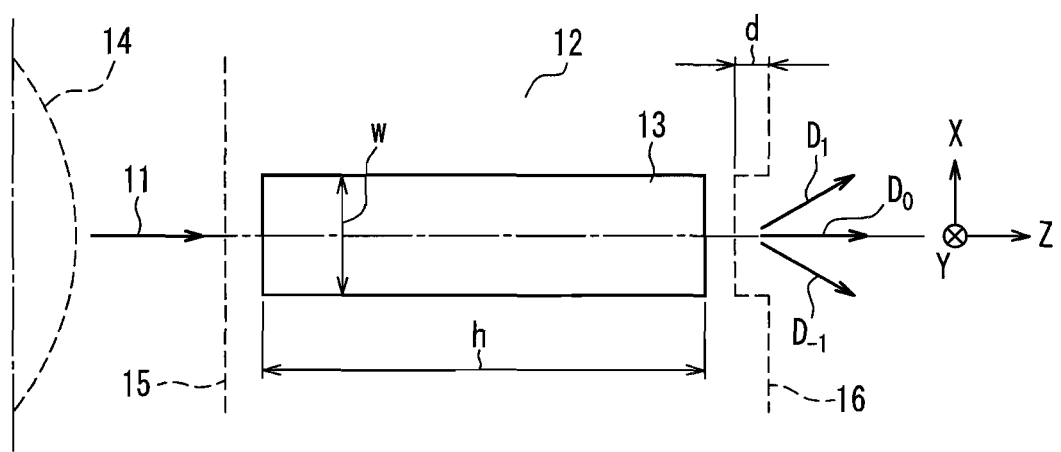
FIG. 2 is a view for explaining a principle that diffracted light is generated by a high refractive index transparent section in an imaging photodetection device according to an embodiment of the present invention.

FIG. 2 is a view for explaining the principle that diffracted light is generated by the high refractive index transparent sections 13 in the imaging photodetection device of the present embodiment. The high refractive index transparent sections 13 are shaped as plates having a width (dimension in the X-axis direction) w and a length (dimension in the Z-axis direction) h, and extending in the Y-axis direction (direction perpendicular to the surface of FIG. 2). Here, 'n' denotes the refractive index of the high refractive index transparent sections 13, and '$n_0$' denotes the refractive index of the surrounding low refractive index transparent layer 12. Here, the wavefront of a light beam 11 entering the high refractive index transparent section 13 through the microlens 10 is denoted as a plane wave 15. As a result of the light beam 11 passing through the high refractive index transparent section 13 and the surrounding low refractive index transparent layer 12, a phase shift d as expressed by the formula below occurs on the wavefront 16 of the outgoing light (in terms of length in vacuum).

$$d=h(n-n_0) \quad \text{(Formula 1)}$$

Due to this phase shift, the outgoing light is diffracted to form a $0^{th}$-order diffracted light $D_0$, a $1^{st}$-order diffracted light $D_1$ and a $-1^{st}$-order diffracted light $D_{-1}$. The diffraction efficiency is determined by the levels of the phase shift d and the width w of the high refractive index transparent section 13 (i.e., the areal occupancy of the cross section of the high refractive index transparent section 13 with respect to the spread of a light distribution 14 of the incident light beam 11).

In the present embodiment, the dimension of the high refractive index transparent sections 13 is set so that d=1.5 λR for a red specification, d=1.5 λG for a green specification, and d=1.5 λB for a blue specification when λR indicates the red wavelength, λG indicates the green wavelength and λB indicates the blue wavelength. Namely, the length of the high refractive index transparent sections 13 is set as follows.

$$h_R = 1.5\lambda R/(n-n_0) \quad \text{(Formula 2)}$$

$$h_G = 1.5\mu G/(n-n_0) \quad \text{(Formula 3)}$$

$$h_B = 1.5\lambda B/(n-n_0) \quad \text{(Formula 4)}$$

According to (Formula 2), in the red-specification high refractive index transparent section 13R, a phase shift of 1.5 wavelengths occurs for the light of the red wavelength λR, a phase shift of 1.5*(λR/λG) wavelengths occurs for the light of the green wavelength λG, and a phase shift of 1.5*(λR/λB) wavelengths occurs for the light of the blue wavelength λB. When λR=0.65 µm, λG=0.54 µm and λB=0.45 µm, the phase shifts for the light of the green wavelength λG and the light of the blue wavelength λB correspond to 1.81 wavelengths and 2.17 wavelengths respectively. As a light beam is a wave, a phase shift for an integral multiple of wavelength is equivalent to zero. Therefore, when the values for the integral multiples of wavelengths are subtracted from the phase shifts of the respective colors, the phase shift for the light of the red wavelength corresponds to 0.5 wavelengths, and the phase shifts for both the light of the green wavelength and the light of the blue wavelength correspond to 0.2 wavelengths or less. Therefore, the light of the red wavelength is diffracted intensively, the $0^{th}$-order diffracted light $D_0$ becomes zero, and the energy is distributed to the $1^{st}$-order diffracted light $D_1$ and the $-1^{st}$-order diffracted light $D_{-1}$. On the other hand, the diffractions of the light of the green wavelength and the light of the blue wavelength are weak, the $1^{st}$-order diffracted light $D_1$ and the $-1^{st}$-order diffracted light $D_{-1}$ are small, and most of the energy is distributed to the $0^{th}$-order diffracted light $D_0$.

According to (Formula 3), in the green-specification high refractive index transparent section 13G, a phase shift of 1.5*(λG/λR) wavelengths occurs for the light of the red wavelength λR, a phase shift of 1.5 wavelengths occurs for the light of the green wavelength λG, and a phase shift of 1.5*(λG/λB) wavelengths occurs for the light of the blue wavelength λB. When λR=0.65 µm, λG=0.54 µm and λB=0.45 µm, the phase shifts for the light of the red wavelength λR and the light of the blue wavelength λB correspond to 1.25 wavelengths and 1.80 wavelengths respectively. When the values for the integral multiple wavelengths are subtracted from the phase shifts of the respective colors, the phase shift for the light of the green wavelength corresponds 0.5 wavelengths, and the phase shifts for both the light of the red wavelength and the light of the blue wavelength correspond to 0.25 wavelengths or less. Therefore, the light of the green wavelength is diffracted intensively, the $0^{th}$-order diffracted light $D_0$ becomes zero, and the energy is distributed to the $1^{st}$-order diffracted light $D_1$ and the $-1^{st}$-order diffracted light $D_{-1}$. On the other hand, the diffractions of the light of the red wavelength and the light of the blue wavelength are weak, the $1^{st}$-order diffracted light $D_1$ and the $-1^{st}$-order diffracted light $D_{-1}$ are small, and most of the energy is distributed to the $0^{th}$-order diffracted light $D_0$.

According to (Formula 4), in the blue-specification high refractive index transparent section 13B, a phase shift of 1.5*(λB/λR) wavelengths occurs for the light of the red wavelength λR, a phase shift of 1.5*(λB/λG) wavelengths occurs for the light of the green wavelength λG, and a phase shift of 1.5 wavelengths occurs for the light of the blue wavelength λB. When λR=0.65 µm, λG=0.54 µm and λB=0.45 µm, the phase shifts for the light of the red wavelength λR and the light of the green wavelength λG correspond to 1.04 wavelengths and 1.25 wavelengths respectively. When the values for the integral multiples of wavelengths are subtracted from the phase shifts of the respective colors, the phase shift for the light of the blue wavelength corresponds to 0.5 wavelengths, and the phase shifts for both the light of the red wavelength and the light of the green wavelength correspond to 0.25 wavelengths or less. Therefore, the light of the blue wavelength is diffracted intensively, the $0^{th}$-order diffracted light $D_0$ becomes zero, and the energy is distributed to the $1^{st}$-order diffracted light $D_1$ and the $-1^{st}$-order diffracted light $D_{-1}$. On the other hand, the diffractions of the light of the red wavelength and the light of the green wavelength are weak, the $1^{st}$-order diffracted light $D_1$ and the $-1^{st}$-order diffracted light $D_{-1}$ are small, and most of the energy is distributed to the $0^{th}$-order diffracted light $D_0$.

Therefore, in FIG. 1B, light of other than red (green and blue, namely cyan) enters the photodetector $6R^-$, light of other than green (red and blue, namely magenta) enters the photodetector $6G^-$, and light of other than blue (red and green, namely yellow) enters the photodetector $6B^-$. Light of green and blue (namely, cyan) enters the photodetector 6GB, light of blue and red (namely, magenta) enters the photodetector 6BR, and light of red and green (namely, yellow) enters the photodetector 6RG.

Figure 3A:
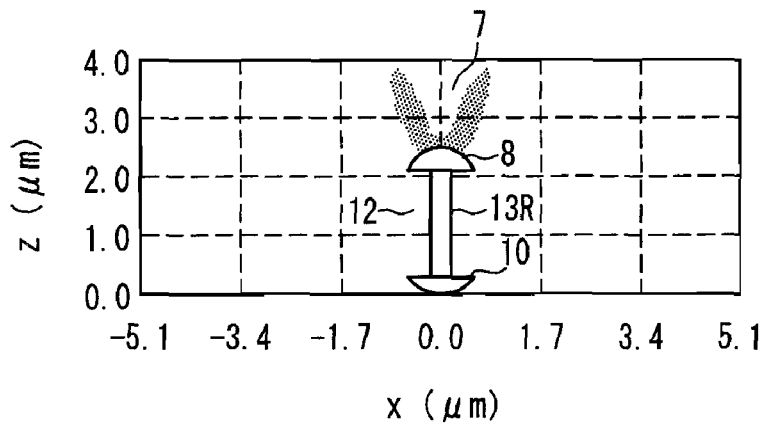
FIG. 3A is a diagram showing an intensity distribution of light of a red wavelength transmitted from a microlens to a photodetector through a red-specification high refractive index transparent section in an imaging photodetection device according to an embodiment of the present invention.
Figure 3B:
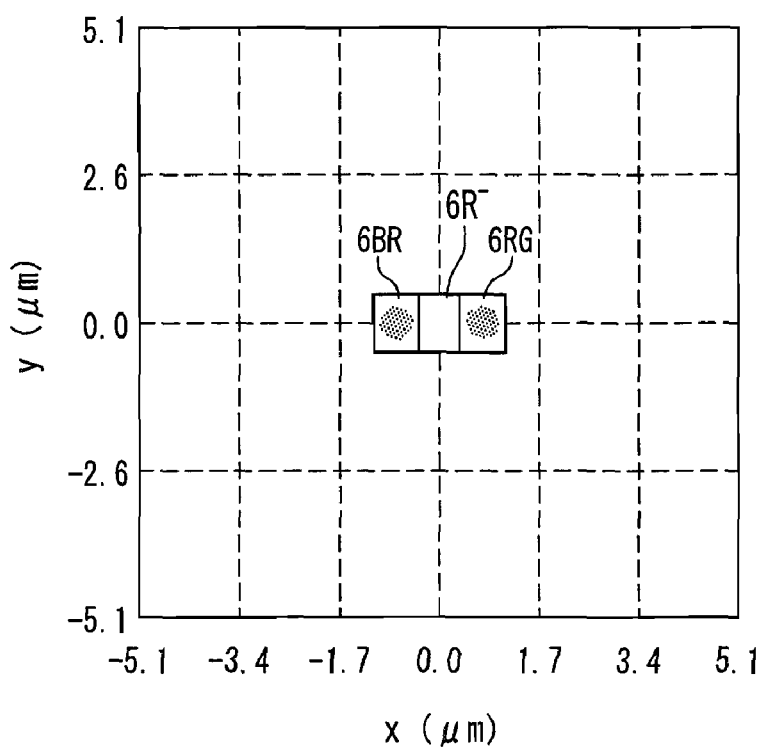
FIG. 3B is a diagram showing an intensity distribution of light of a red wavelength projected on a photodetector through a red-specification high refractive index transparent section in an imaging photodetection device according to an embodiment of the present invention.
Figure 4A:
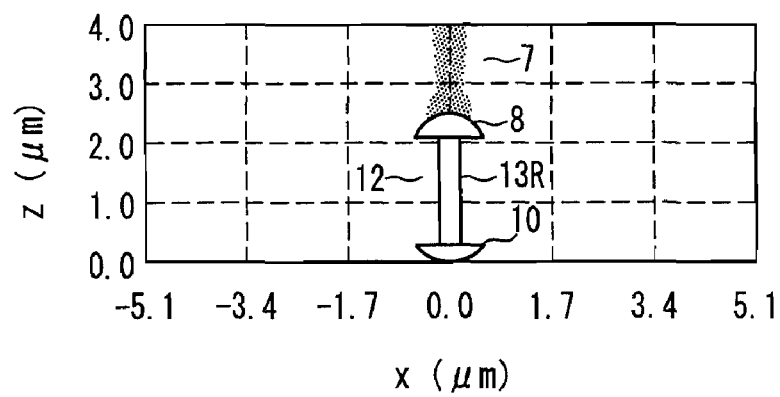
FIG. 4A is a diagram showing an intensity distribution of light of a blue-green wavelength transmitted from a microlens to a photodetector through a red-specification high refractive index transparent section in an imaging photodetection device according to an embodiment of the present invention.
Figure 4B:
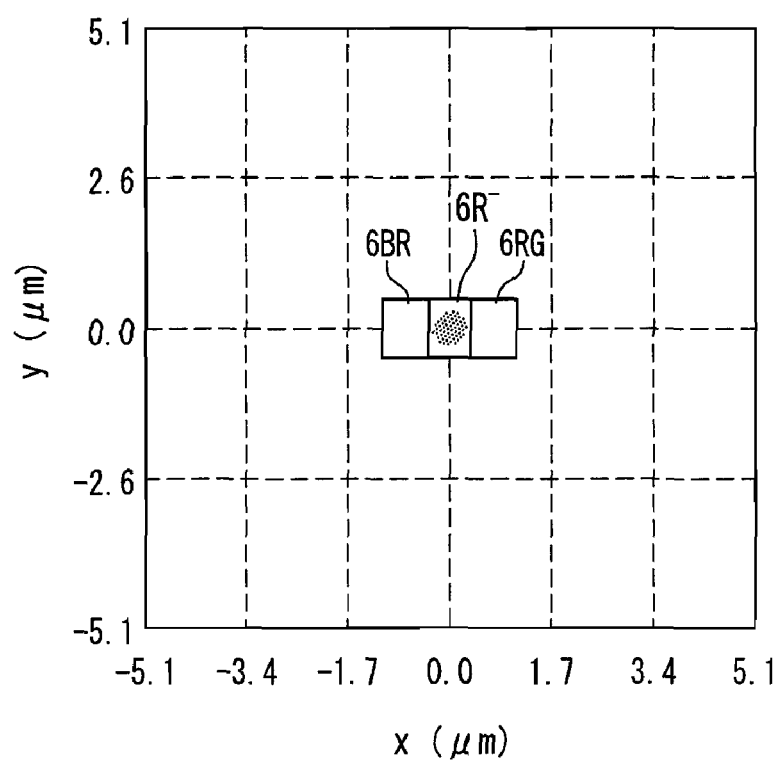
FIG. 4B is a diagram showing an intensity distribution of light of a blue-green wavelength projected on a photodetector through a red-specification high refractive index transparent section in an imaging photodetection device according to an embodiment of the present invention.

FIGS. 3A and 4A are diagrams showing intensity distributions of light transmitted from the microlens 10 to the photodetector 6 through the red-specification high refractive index transparent section 13R in an imaging photodetection device according to the present embodiment (showing only the intensity distribution after exiting from the high refractive index transparent section). FIGS. 3B and 4B are diagrams showing intensity distributions of light projected on the photodetector 6. This example refers to a case where the red-specification high refractive index transparent section 13R is used for the high refractive index transparent section, and the width w=0.35 µm and the length h=1.8 µm. The end of the red-specification high refractive index transparent section 13R is in contact with the flat surface 8a (see FIG. 1B) of the high refractive index transparent buffer layer 8. On the central axis of the microlens 10, the thickness of the microlens is set to 0.3 µm, the thickness of the low refractive index transparent buffer layer 7 is set to 1.5 µm, and the thickness of the high refractive index transparent buffer layer 8 is set to 0.4 µm. The microlens 10, the transparent buffer layer 7 and the low refractive index transparent layer 12 have the same refractive index of $n_0$. And both the transparent buffer layer 8 and the high refractive index transparent section 13R have the same refractive index of n. FIGS. 3A and 3B show a calculation result for the wave of light entering the microlens 10 along the central axis under the condition of light wavelength λ=0.65 µm (red wavelength), n=2.020 and $n_0$=1.454. FIGS. 4A and 4B show a calculation result for the wave of light entering the microlens 10 along the central axis under the condition of light wavelength λ=0.50 µm (blue-green wavelength), n=2.212 and $n_0$=1.461. In FIGS. 3A and 3B, the light of red wavelength (λ=0.65 µm) is diffracted intensively, the $0^{th}$-order diffracted light becomes zero, and the energy is distributed to the $±1^{st}$-order diffracted lights. FIGS. 4A and 4B show that diffraction of the light of blue-green wavelength (λ=0.50 µm) is weak, the $±1^{st}$-order diffracted lights are small, and most of the energy is distributed to the $0^{th}$-order diffracted light.

Figure 5:
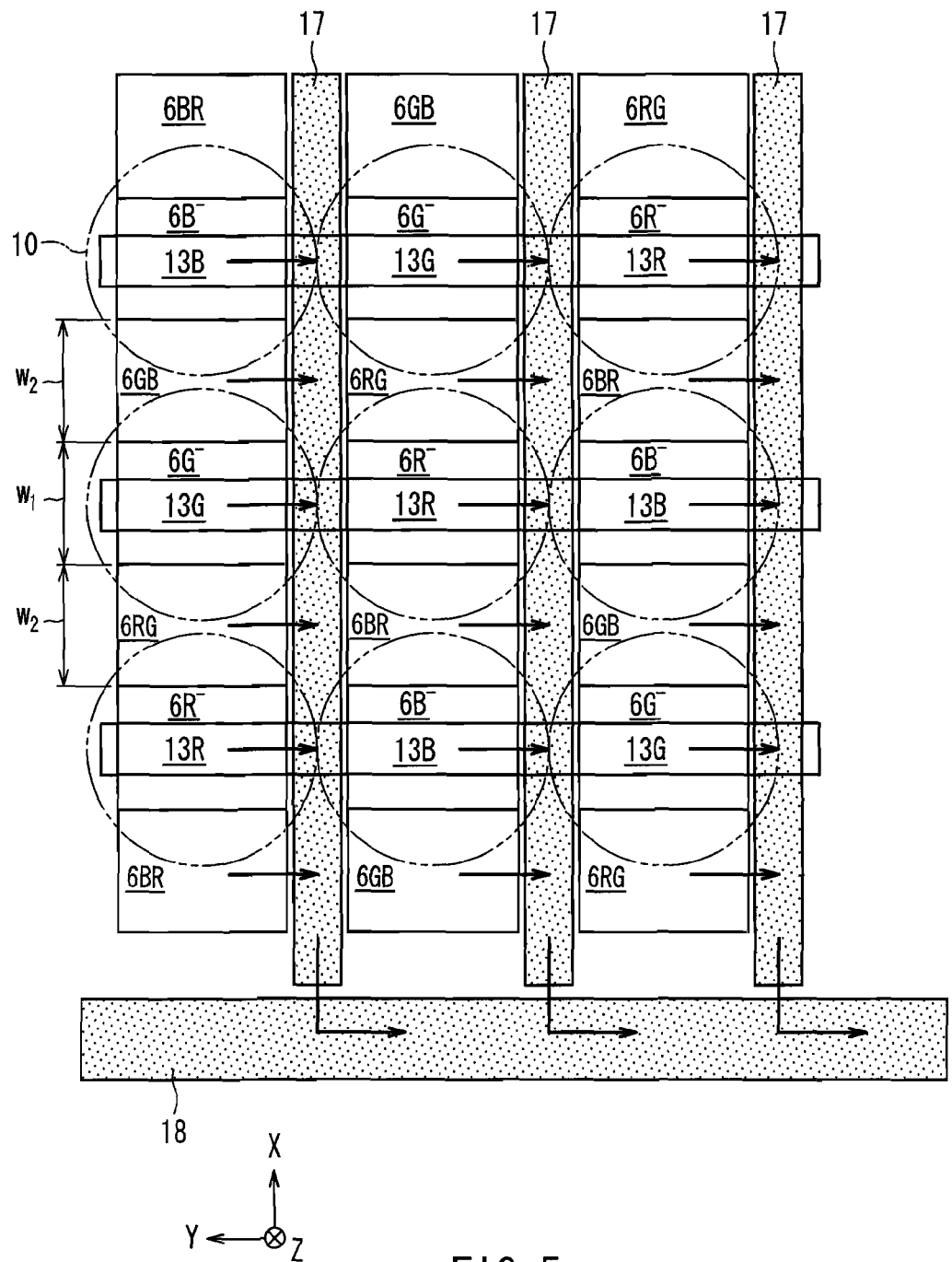
FIG. 5 is a magnified plan view of a photodetection plane, showing a planar arrangement of components of an imaging photodetection device according to an embodiment of the present invention.

FIG. 5 is a magnified plan view showing components including the photodetection plane of the imaging photodetection device of the present embodiment. A plurality of vertical transfer CCDs 17 as signal wirings extending in the X-axis direction are provided between the photodetectors 6 adjacent to each other in the Y-axis direction. The vertical transfer CCDs 17 are connected to a horizontal transfer CCD 18 as a signal wiring extending in the Y-axis direction.

Light focused by the microlenses 10 passes through the high refractive index transparent sections 13R, 13G and 13B located just under the microlenses 10 and diffracted to be classified in the XZ plane by wavelength, and received by the photodetectors $6R^-$, $6G^-$, $6B^-$, 6GB, 6BR and 6RG so as to be photoelectrically converted. The electric charge stored in the respective photodetectors is sent to the vertical transfer CCDs 17, and further sent to the horizontal transfer CCD 18 so as to be outputted as image signals.

In the X-axis direction, the high refractive index transparent sections 13R, 13G and 13B are arrayed in this order, and this sequence is repeated. The pitch for arranging the high refractive index transparent sections in the array of the high refractive index transparent sections along the X-axis direction is constant. The arrays in which the high refractive index transparent sections are thus arrayed along the X-axis direction are arranged in the Y-axis direction with a shift of one pitch in the X-axis direction. As a result, similarly in the Y-axis direction, the high refractive index transparent sections 13R, 13G and 13B are arrayed in this order, and the sequence is repeated.

The photodetectors $6R^-$, $6G^-$ and $6B^-$ are arranged respectively just under the high refractive index transparent sections 13R, 13G and 13B (i.e., on the central axes of the respective microlenses 10). Further in the X-axis direction, the photodetector 6RG is arranged between the photodetectors $6R^-$ and $6G^-$; the photodetector 6GB is arranged between the photodetectors $6G^-$ and $6B^-$; and the photodetector 6BR is arranged between the photodetectors $6B^-$ and $6R^-$. Though the width (dimension in the X-axis direction) $w_1$ of the photodetectors $6R^-$, $6G^-$ and $6B^-$ can be equal to or different from the width (dimension in the X-axis direction) $w_2$ of the photodetectors 6GB, 6BR and 6RG, $w_2 > w_1$ is preferred as the spot for the $±1^{st}$-order diffracted lights tends to spread in comparison to the $0^{th}$-order diffracted light.

Figure 9A:
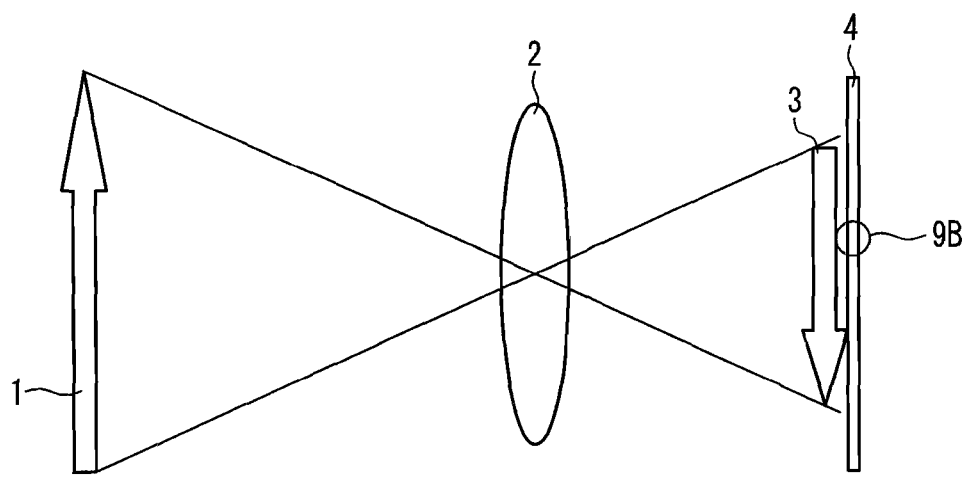
FIG. 9A is a side view showing a schematic configuration of a conventional imaging photodetection device.
Figure 9B:
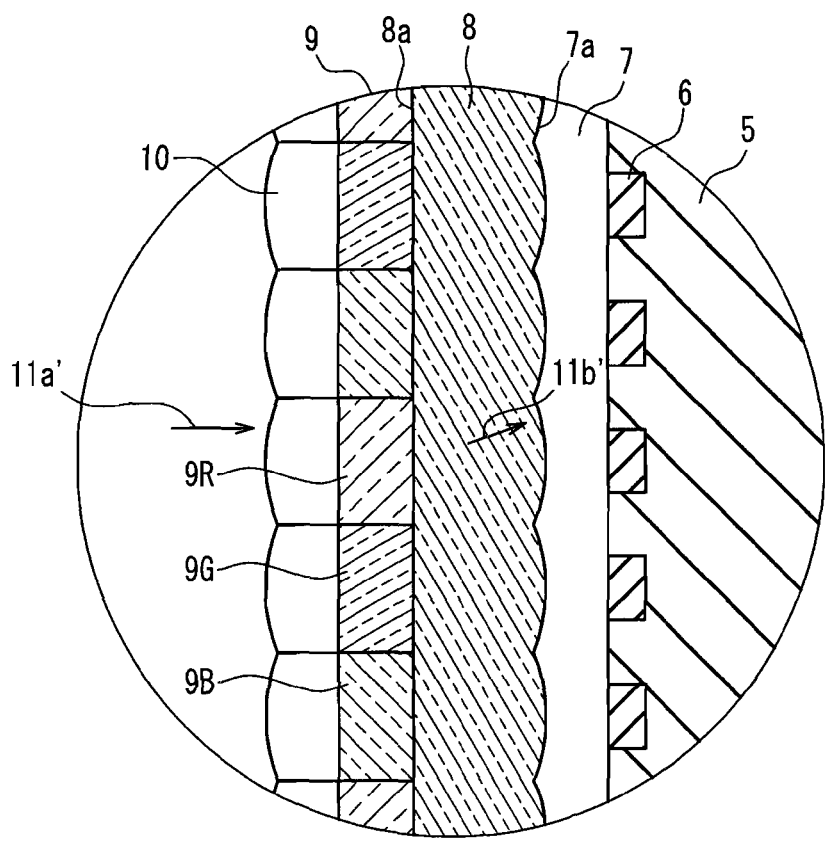
FIG. 9B is a magnified cross-sectional view of the portion 9B in FIG. 9A, showing a schematic configuration of a conventional imaging photodetection device.
Figure 10:
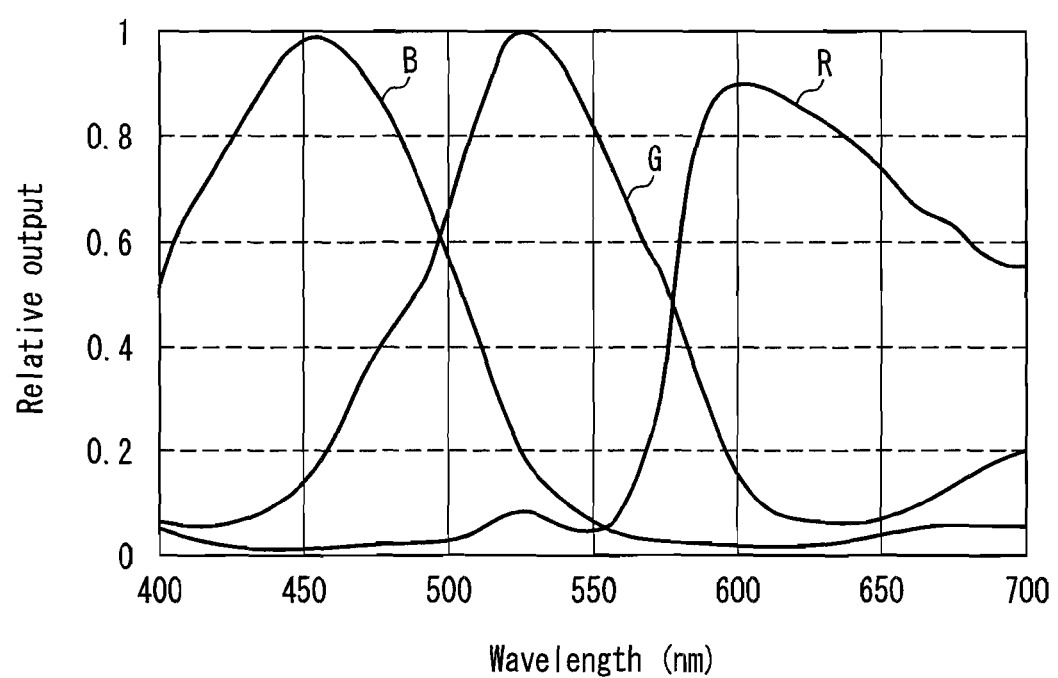
FIG. 10 is a graph showing spectral sensitivity characteristics of three kinds of color filters used for a conventional imaging photodetection device.

In the conventional imaging photodetection device as shown in FIG. 9B, pieces of image information in three colors of red, green and blue are captured and combined to form a color image. In contrast, according to the present embodiment, pieces of image information in three colors of cyan, magenta and yellow that correspond to the complementary colors of the three primary colors are captured and combined to form a color image. The cyan signal is detected from the photodetectors $6R^-$ and 6GB, the magenta signal is detected from the photodetectors $6G^-$ and 6BR, and the yellow signal is detected from the photodetectors $6B^-$ and 6RG.

As described above, in the conventional imaging photodetection device as shown in FIG. 9B, color separation of light is carried out by the color filters 9 that absorb selectively two of three colors of red, green and blue. Therefore, 70 to 80% of light is absorbed by the color filters 9. In contrast, in the imaging photodetection device of the present embodiment, color separation of light is carried out by using not light absorption but light diffraction, and thus the whole energy of light can be utilized. As a result, in the present embodiment, the efficiency for light utilization is improved three to four times in comparison with the conventional imaging photodetection device.

Further, in the conventional imaging photodetection device as shown in FIG. 9B, information of one color is detected through each of the microlenses. In contrast, in the imaging photodetection device of the present embodiment, two kinds of color information are detected through each of the microlenses. Therefore, when the size of the microlenses 10 is unified, it is possible in the present embodiment to double the pixel density in comparison with the conventional imaging photodetection device.

Figure 12:
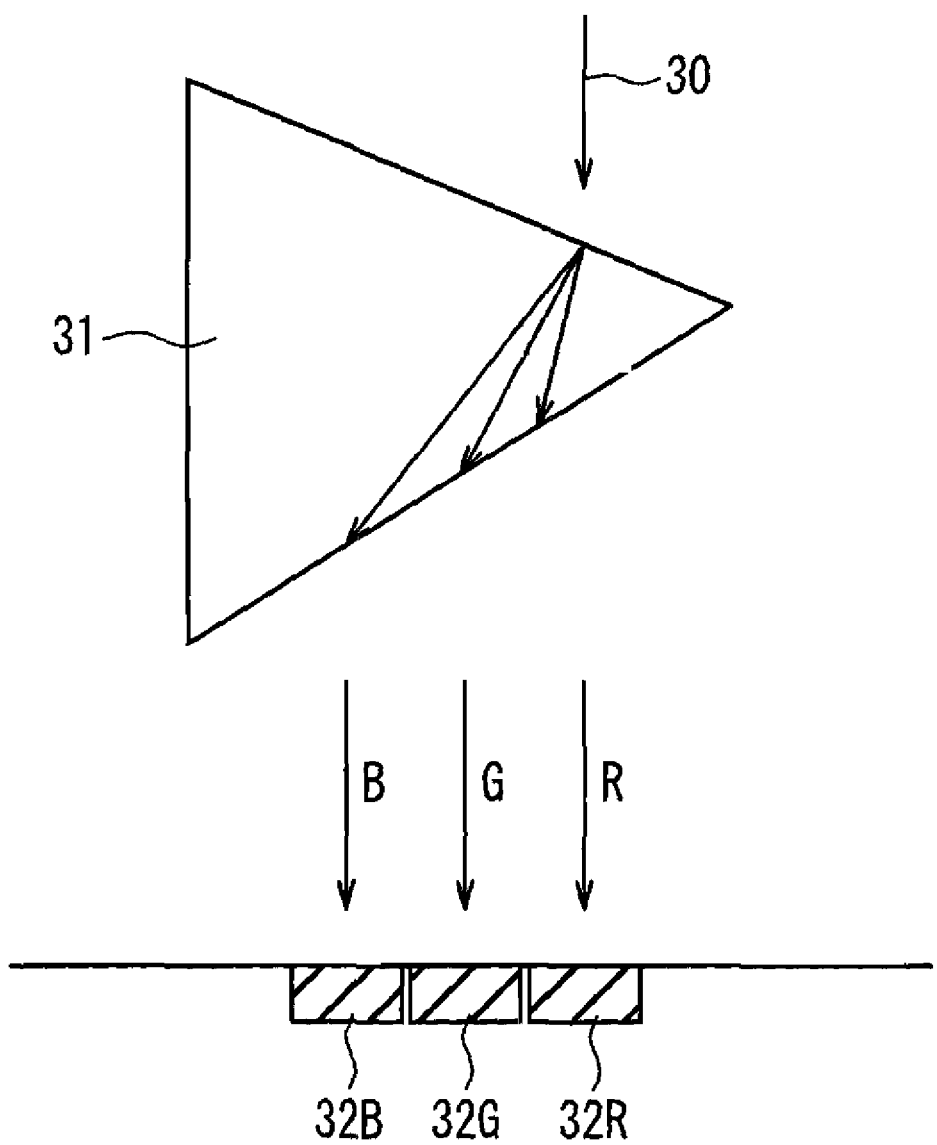
FIG. 12 is a view showing a principle of a conventional photodetection device that carries out color separation by using a microprism.

Furthermore, in the conventional imaging photodetection device as shown in FIG. 12, there has been a problem that the spectral action (difference in the refractive angle by wavelength) is small since the dispersion characteristic of a prism is used for color separation of light. In contrast, in the imaging photodetection device of the present embodiment, the spectral action (difference in the refractive angle by wavelength) is large since the phase shift occurring on the wavefront of light is used. Therefore, as shown in FIGS. 3B and 4B, by setting the spacing between the tip of the high refractive index transparent section and the photodetection plane to only 1 to 2 μm, a displacement of at least 0.5 μm can be provided between the three spots of the $0^{th}$-order diffracted light (complementary colors) and the $\pm 1^{st}$-order diffracted lights (primary colors), which is a sufficiently practical dimension in a trial production.

Figure 6A:
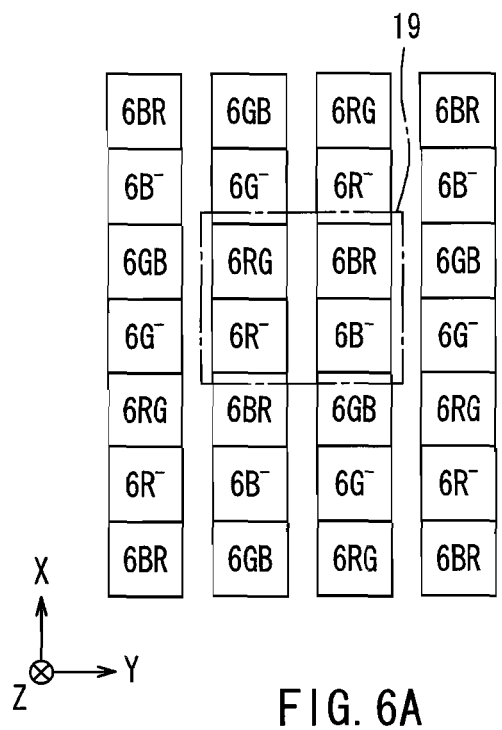
FIG. 6A is a view showing an example of an arrangement of photodetectors in an imaging photodetection device according to an embodiment of the present invention.

FIG. 6A is a view showing an example of an arrangement of photodetectors in an imaging photodetection device of the present embodiment, and the arrangement is identical to that in FIG. 5. FIG. 6A is a magnified view showing the arrangement of a part of numbers of photodetectors. Signals of complementary colors of three primary colors can be detected without fail from four photodetectors of 2 (X-axis direction)×2 (Y-axis direction) included in a rectangular frame 19 at an arbitrary position indicated by an alternate long and short dashed line. Therefore, it is possible to configure one pixel for detecting color image information by using the four photodetectors in the rectangular frame 19, and this pixel can be formed on the entire region of the photodetection plane of the photodetection device.

FIG. 6A is not a limiting example of an arrangement of photodetectors for enabling detection of signals of complementary colors of the three primary colors from four photodetectors of 2 (X-axis direction)×2 (Y-axis direction) included in a rectangular frame 19 at an arbitrary position.

For example, it is possible to provide an arrangement of photodetectors different from that in FIG. 6A by arranging the sequence of the high refractive index transparent sections 13R, 13B and 13G repeatedly in the X-axis direction.

Figure 6B:
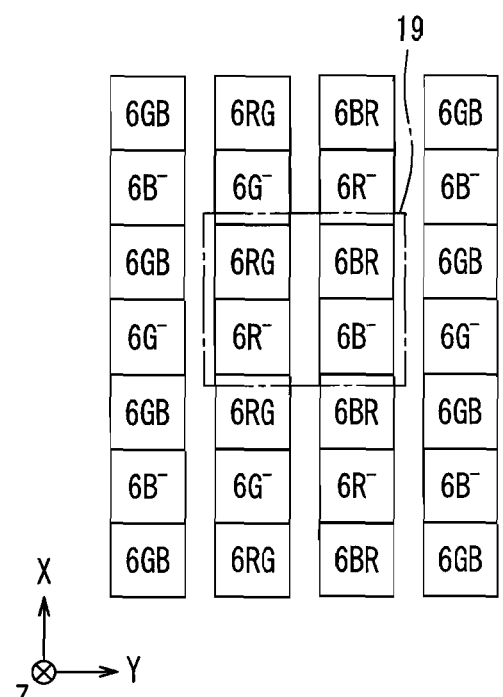
FIG. 6B is a view showing another example of an arrangement of photodetectors in an imaging photodetection device according to an embodiment of the present invention.

Alternatively, it is possible to arrange two of the high refractive index transparent sections 13R, 13G and 13B alternately in the X-axis direction, and to arrange the sequence of the high refractive index transparent sections 13R, 13G and 13B repeatedly in the Y-axis direction. FIG. 6B shows an arrangement of photodetectors in a case where the high refractive index transparent sections 13R, 13G and 13B are arranged in this manner. Similarly in this case, signals of complementary colors of three primary colors can be detected without fail from four photodetectors of 2 (X-axis direction)×2 (Y-axis direction) included in a rectangular frame 19 at an arbitrary position indicated by an alternate long and short dashed line. It is also possible to arrange two of the high refractive index transparent sections 13R, 13G and 13B alternately in the X-axis direction, and to arrange the sequence of the high refractive index transparent sections 13R, 13B and 13G repeatedly in the Y-axis direction.

Figure 7:
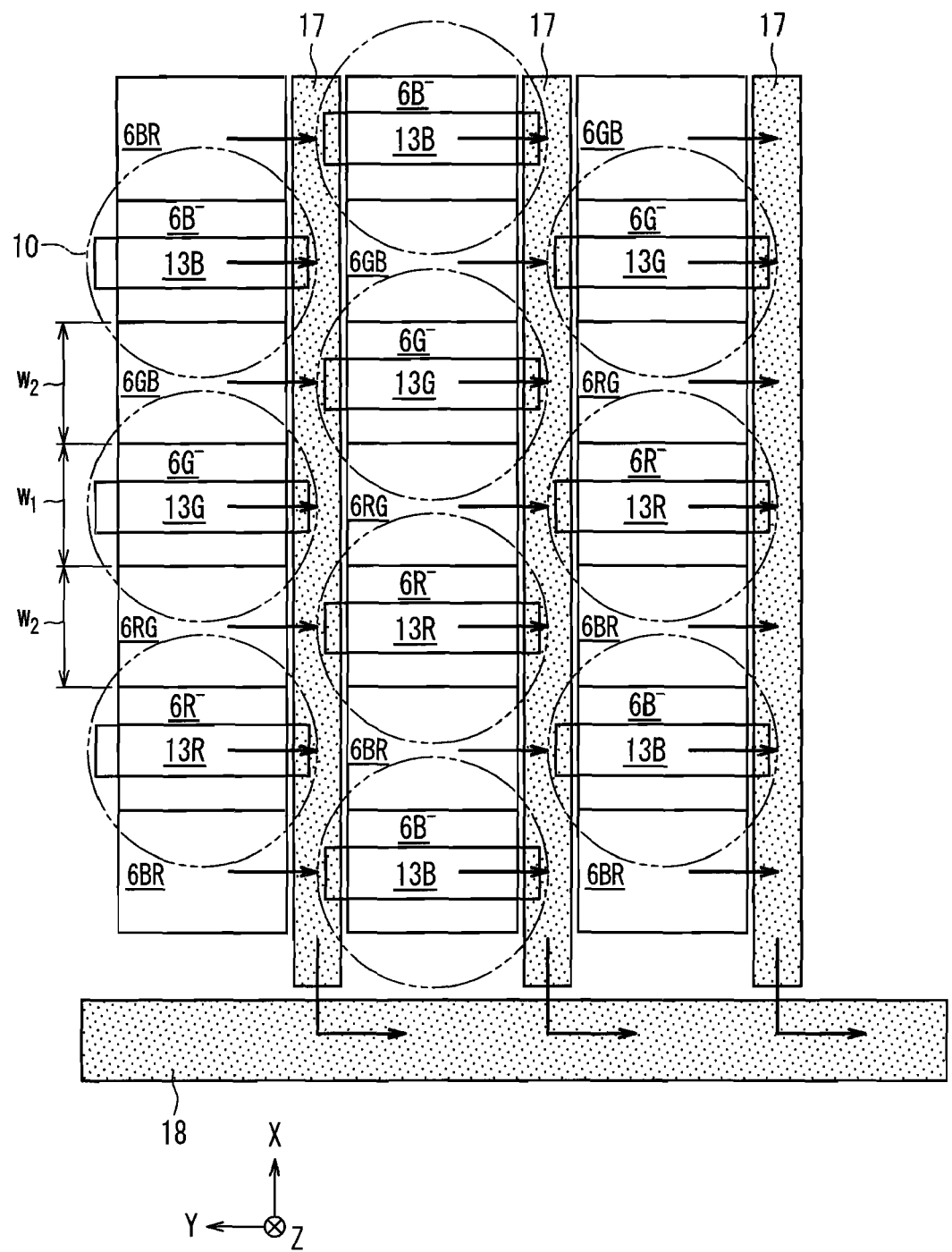
FIG. 7 is a magnified plan view of a photodetection plane, showing a planar arrangement of components of an imaging photodetection device according to another embodiment of the present invention.

It is also possible to shift the positions in the X-axis direction of the microlenses and the high refractive index transparent sections composing the respective arrays along the X-axis direction of the microlenses and the high refractive index transparent sections, between the arrays adjacent to each other in the Y-axis direction, by the half of the arrangement pitch in the X-axis direction. FIG. 7 is a magnified plan view showing an example of the imaging photodetection device of the present invention having the arrangement. FIG. 7 shows the microlenses and the high refractive index transparent sections shown in FIG. 5, whose positions in the X-axis direction are shifted by 0.5 pitches in the X-axis direction between the arrays adjacent to each other in the Y-axis direction. The positions in the X-axis direction of the photodetectors also are shifted in accordance with the shifts of the microlenses and the high refractive index transparent sections. Due to the arrangement as shown in FIG. 7, the microlenses that are shaped circular when viewed in parallel to the Z axis can be arranged in honeycomb. Thereby, it is possible to decrease the arrangement pitch in the Y-axis direction of the microlenses and the high refractive index transparent sections so as to further improve the efficiency for utilization of light obtained from a photographic subject. FIG. 7 shows a variation of the arrangement shown in FIG. 5. Similar variations are available for arrangements other than that in FIG. 5.

In the above-mentioned embodiment, the respective high refractive index transparent sections 13R, 13G and 13B are set so that the phase shift d will be: d=1.5 λR for a red specification, d=1.5 λG for a green specification, and d=1.5λB for a blue specification. Though this condition seems to be the most favorable combination of the high refractive index transparent sections 13R, 13G and 13B, the present invention is not limited to this example. For instance, it is also possible to set at least one of the high refractive index transparent sections 13R, 13G and 13B so that d=('zero or an integer greater than zero'+0.5)×λ, where λ is any one of λR, λG and λB.

Namely, the length of the high refractive index transparent sections 13 can be determined in the following manner where a, b and c are zero or integers greater than zero, in place of (Formula 2), (Formula 3) or (Formula 4).

$$h_R = \lambda R*(2*a+1)/\{2*(n-n_0)\} \quad \text{(Formula 5)}$$

$$h_G = \lambda G*(2*b+1)/\{2*(n-n_0)\} \quad \text{(Formula 6)}$$

$$h_B = \lambda B*(2*c+1)/\{2*(n-n_0)\} \quad \text{(Formula 7)}$$

For example, when (Formula 3) is replaced by:

$$h_G = 2.5\lambda G/(n-n_0), \quad \text{(Formula 6')}$$

in the green-specification high refractive index transparent section 13G, a phase shift of 2.5*(λG/λR) wavelengths occurs for the light of the red wavelength λR, a phase shift of 2.5 wavelengths occurs for the light of the green wavelength λG, and a phase shift of 2.5*(λG/λB) wavelengths occurs for the light of the blue wavelength λB. When λR=0.65 λm, λG=0.54 μm and λB=0.45 μm, the phase shifts for the light of the red wavelength λR and the light of the blue wavelength λB correspond to 2.08 wavelengths and 3.0 wavelengths respectively. When the values for the integral multiples of wavelengths are subtracted from the phase shifts of the respective colors, the phase shift for the light of the green wavelength corresponds to 0.5 wavelengths, and the phase shifts for both the light of the red wavelength and the light of the blue wavelength correspond to 0.1 wavelengths or less. Therefore, the light of the green wavelength is diffracted intensively, the $0^{th}$-order diffracted light $D_0$ becomes zero, and the energy is distributed to the $1^{st}$-order diffracted light $D_1$ and the $-1^{st}$-order diffracted light $D_{-1}$. On the other hand, the diffractions of the light of the red wavelength and the light of the blue wavelength are considerably weak, the $1^{st}$-order diffracted light $D_1$ and the $-1^{st}$-order diffracted light $D_{-1}$ are substantially zero, and most of the energy is distributed to the $0^{th}$-order diffracted light $D_0$.

The above embodiment refers to an example of using three kinds of high refractive index transparent sections of a red specification, a green specification and a blue specification, for the purpose of separating light in the visible range into the complementary colors of the three primary colors of red, green and blue. However, the present invention is not limited to this example.

For instance, it is also possible to provide at least one kind of high refractive index transparent section corresponding to a further wavelength (e.g., a wavelength of infrared light), in addition to the above-mentioned three kinds of high refractive index transparent sections. Alternatively, it is possible to replace at least any one of the high refractive index transparent sections of the red specification, green specification and blue specification to a high refractive index transparent section corresponding to a wavelength of other than the three primary colors (e.g., a wavelength of infrared light).

Furthermore, the kinds of the specifications for the high refractive index transparent sections are not limited to three or more, but the kinds can be two, for example. In this case, when a first wavelength (e.g., a wavelength of infrared light) is indicated as $\lambda 1$ and a second wavelength (wavelength of green light) is indicated as $\lambda 2$ where a and b are zero or integers greater than zero, it is preferable that dimensions of a first specification high refractive index transparent section and a second specification high refractive index transparent section are set so that the phase shift d becomes $\lambda 1*(a+\frac{1}{2})$ at the first specification high refractive index transparent section corresponding to the first wavelength, and $\lambda 2*(b+\frac{1}{2})$ at the second specification high refractive index transparent section corresponding to the second wavelength. Namely, it is preferable that the lengths h1 and h2 in the thickness direction of the high refractive index transparent sections of the first specification and the second specification are set as follows.

$$h1 = \lambda 1*(2*a+1)/\{2*(n-n_0)\} \quad \text{(Formula 8)}$$

$$h2 = \lambda 2*(2*b+1)/\{2*(n-n_0)\} \quad \text{(Formula 9)}$$

In this case, similarly to the above-described embodiment, the high refractive index transparent sections can be made shorter as the values of a and b become smaller (e.g., zero or 1), and thereby an optical loss can be reduced and the production will become easier.

Figure 8A:
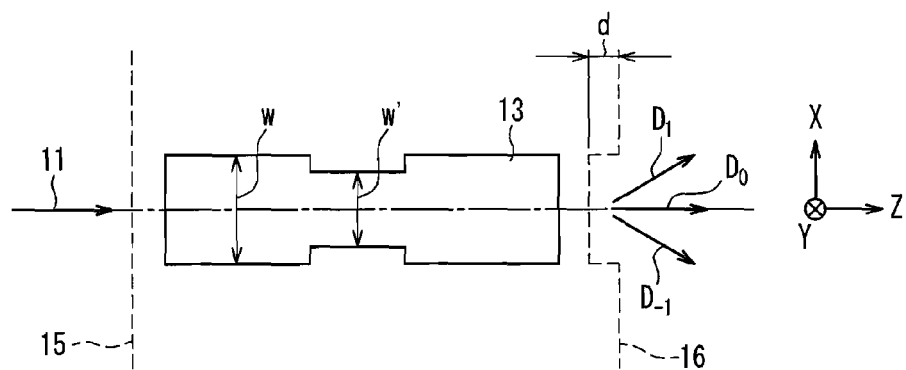
FIG. 8A is a view for explaining a principle that diffracted light is generated by another high refractive index transparent section in an imaging photodetection device according to an embodiment of the present invention.
Figure 8B:
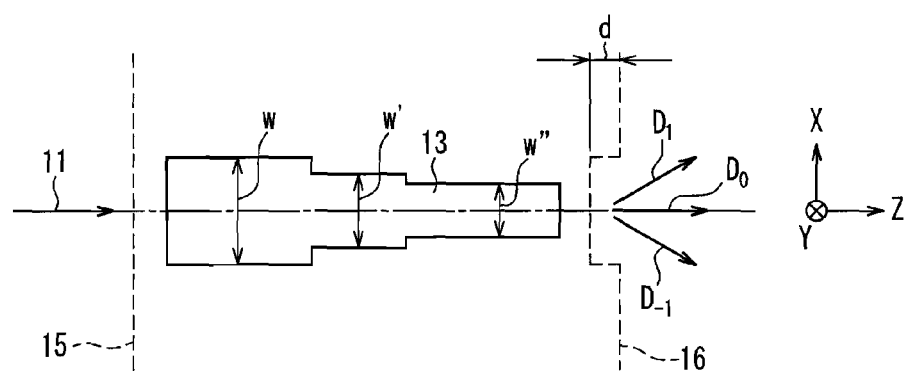
FIG. 8B is a view for explaining a principle that diffracted light is generated by still another high refractive index transparent section in an imaging photodetection device according to an embodiment of the present invention.
Figure 8C:
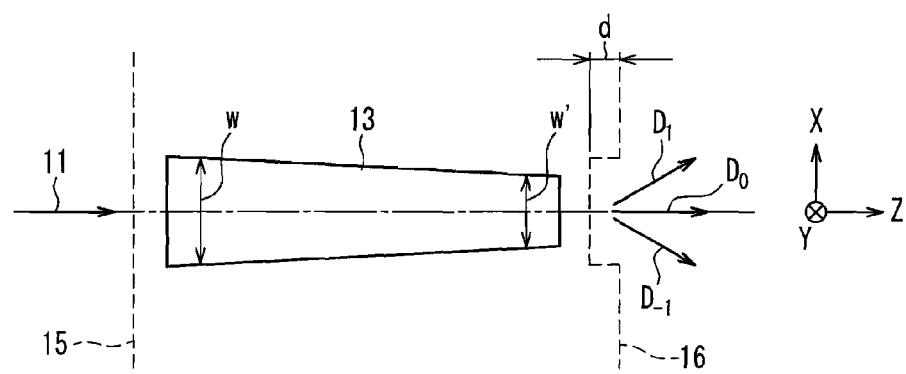
FIG. 8C is a view for explaining a principle that diffracted light is generated by still another high refractive index transparent section in an imaging photodetection device according to an embodiment of the present invention.
Figure 8D:
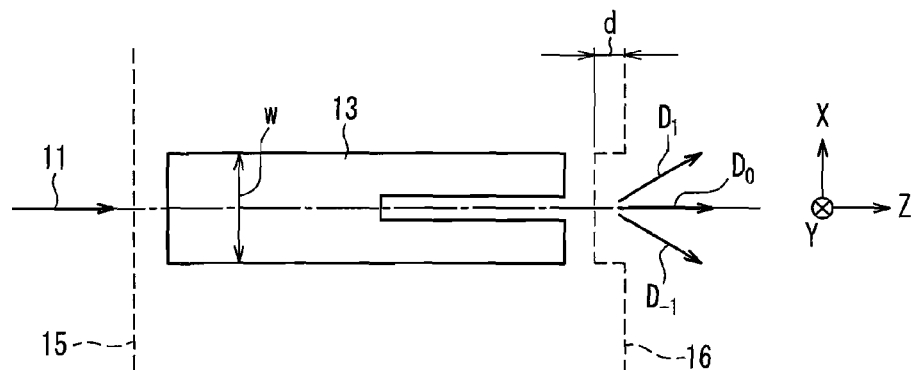
FIG. 8D is a view for explaining a principle that diffracted light is generated by still another high refractive index transparent section in an imaging photodetection device according to an embodiment of the present invention.

In the above embodiment, each of the high refractive index transparent sections 13 is shaped so that the width w is unchanged in the Z-axis direction as shown in FIG. 2. Alternatively, the high refractive index transparent section 13 can be shaped to have two different widths w, w' as shown in FIG. 8A, or it can have three or more different widths as shown in FIG. 8B. Further, as shown in FIG. 8C, it can be shaped so that the width is decreased (or increased) gradually in the Z-axis direction. Alternatively, as shown in FIG. 8D, the high refractive index transparent section 13 can be branched like a fork in the width direction into two or more at the photodetector side. The high refractive index transparent sections 13 adjacent to each other in the Y-axis direction can be continuous at parts with each other while changing the length h (dimension in the Z-axis direction), or they can be independent (divided) completely. When the high refractive index transparent sections 13 are provided independently, spaces between the adjacent high refractive index transparent sections 13 are filled with the low refractive index transparent layer 12.

In the above embodiment, the high refractive index transparent sections 13 are in contact with the lower surfaces of the microlenses 10 in the Z-axis direction. Alternatively the high refractive index transparent sections 13 and the microlenses 10 can be separated from each other. In such a case, a low refractive index transparent layer 12 can be provided therebetween.

Since the high refractive index transparent sections 13 have a function as a waveguide to guide incident light to the photodetector side while suppressing the light from spreading, the microlenses 10 having the similar function can be omitted under certain conditions. However, since the high refractive index transparent sections 13 extend in the Y-axis direction, the effect as a waveguide in the Y-axis direction is insufficient. Therefore, in order to substitute the microlenses 10 with the high refractive index transparent sections 13, it is preferable to form cylindrical surfaces having the central axes in the X-axis direction for every array of the high refractive index transparent sections, on at least the incident side surface of the high refractive index transparent sections 13 and of the low refractive index transparent layer 12.

Figure 8E:
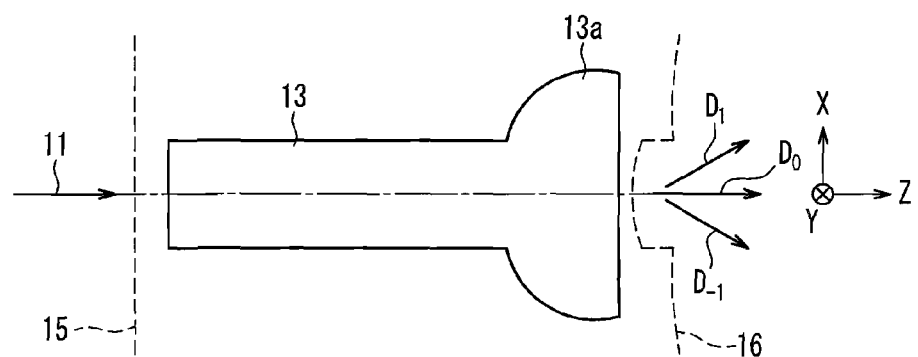
FIG. 8E is a view for explaining a principle that diffracted light is generated by still another high refractive index transparent section in an imaging photodetection device according to an embodiment of the present invention.
Figure 8F:
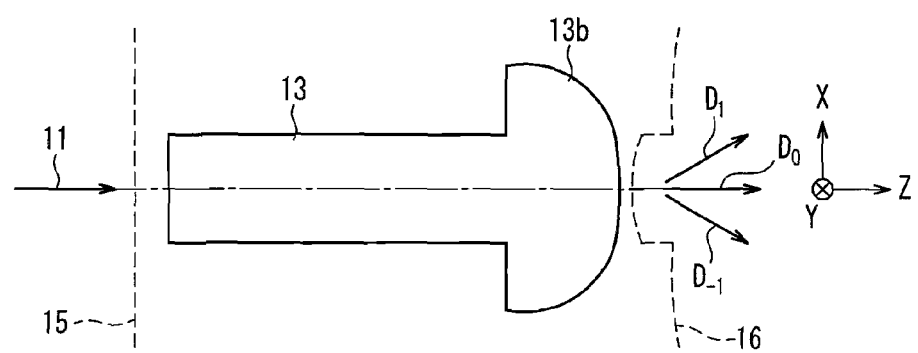
FIG. 8F is a view for explaining a principle that diffracted light is generated by still another high refractive index transparent section in an imaging photodetection device according to an embodiment of the present invention.

Further, in the above embodiment, an uneven structure is formed on the surface 7a of the transparent buffer layer 7 in contact with the transparent buffer layer 8 so as to exhibit a lens effect, thereby refracting the divergent light beam 11b' that travels in a direction away from the center of the photodetector 6 and guiding the light to the photodetector 6. It is possible to have the high refractive index transparent sections 13 exhibit this action by forming a lenticular portion 13a as shown in FIG. 8E or a lenticular portion 13b as shown in FIG. 8F, at the end of the high refractive index transparent section 13 at the photodetector 6 side. As a result, the uneven structure of the surface 7a on the transparent buffer layer 7 and also a high refractive index transparent buffer layer 8 can be omitted, and the buffer layers 7 and 8 can be replaced by a transparent buffer layer as a single layer.

In the above embodiment, the photodetectors 6 are arrayed two-dimensionally along the X-axis direction and the Y-axis direction. Alternatively, the photodetectors 6 can be arrayed one-dimensionally. In such a case, both the microlenses 10 and the high refractive index transparent sections 13 are arrayed one-dimensionally along the array direction of the photodetectors 6.

In the above embodiment, the size (length h) of the high refractive index transparent sections is varied in accordance with the wavelength of light to be separated. Alternatively, it is possible to vary the refractive index and/or the shape of the high refractive index transparent sections. In such a case, it is possible to separate light of a desired wavelength by causing a phase shift similarly to the above embodiment.

Though the above embodiment refers to an example of using SiN as the material of the high refractive index transparent sections 13, the present invention is not limited to this example. For instance, high refractive index materials such as tantalum oxide and titanium oxide can be used. Even resin materials such as a polyimide resin, nano-composites and the like can be used as long as a difference in the refractive index of at least 0.2 can be ensured with respect to the low refractive index transparent layer 12.

Figure 11:
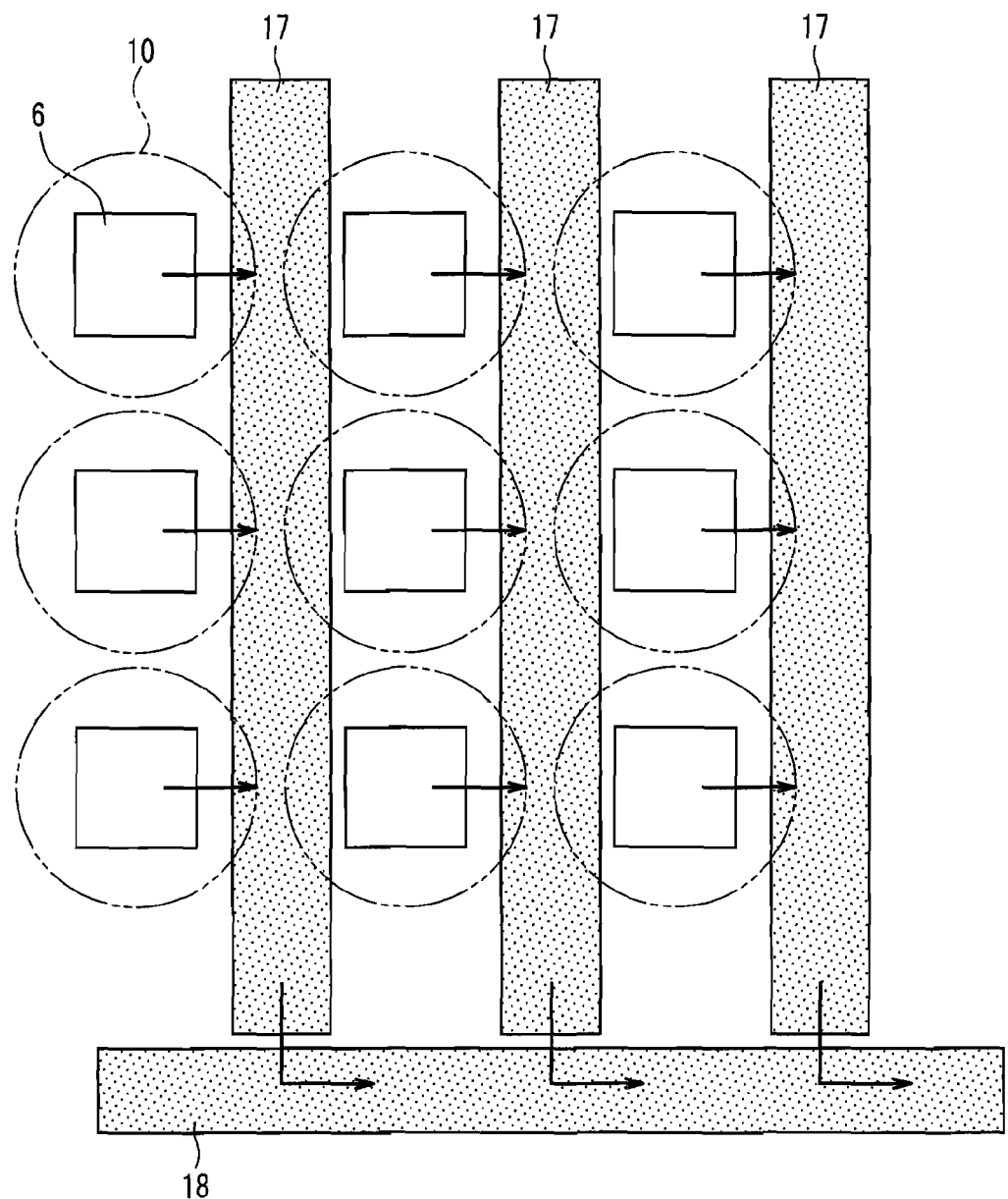
FIG. 11 is a magnified plan view of a photodetection plane, showing a planar arrangement of components of a conventional imaging photodetection device.

Actually a light-shielding portion such as metal wirings is interposed between the microlenses and photodetectors in the light-receiving regions of the conventional photodetection device as shown in FIGS. 9B and 11, and thus a part of light entering the light-receiving region will be shielded by the light-shielding portion. The same can be said of the photodetection device as described in the above embodiment. Recently however, backside-illumination type solid-state image sensors have been developed, and such a solid-state image sensor can receive light on the whole surface of the light-receiving region without influences of the metal wirings. The photodetection device of the present invention can improve the efficiency for light utilization as a result of performing color separation by using optical diffraction. Therefore, application of the photodetection device of the present invention to the backside-illumination type solid-state image sensor is considered as effective since the efficiency for light utilization can be improved further.

The embodiment described above solely is intended to elucidate the technological content of the present invention, and the present invention is not limited to or by these specific examples alone. Various modifications are possible within the scope of the claims and the spirit of the invention, and the present invention should be interpreted broadly.

INDUSTRIAL APPLICABILITY

The present invention can be applied to any fields without any particular limitations and can be utilized as a small and high-resolution imaging photodetection device for picking up an image of an object.

The invention claimed is:

1. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors; wherein
light entering any one of the high refractive index transparent sections and the low refractive index transparent layer surrounding each of the high refractive index transparent sections is separated into a $0^{th}$-order diffracted light, a $1^{st}$-order diffracted light and $-1^{st}$ order diffracted light by a single phase shift occurring on the wavefront due to passing of the light therethrough, and
wherein the $0^{th}$-order diffracted light, the $1^{st}$-order diffracted light and $-1^{st}$-order diffracted light from said any one of the high refractive index transparent sections are detected by photodetectors different from each other.

2. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a red-specification high refractive index transparent section, a green-specification high refractive index transparent section and a blue-specification high refractive index transparent section, which are different from each other in at least one of the refractive index, the shape and the size, and
the phase shift occurring between light passing through the high refractive index transparent sections and light passing through the low refractive index transparent layer is:
(a+½) times a red wavelength for the case of the red-specification high refractive index transparent section,
(b+½) times a green wavelength for the case of the green-specification high refractive index transparent section, and (c+½) times a blue wavelength for the case of the blue-specification high refractive index transparent section, where a, b and c are zero or integers greater than zero.

3. The imaging photodetection device according to claim 2, wherein a, b and c are zero or 1.

4. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a red-specification high refractive index transparent section, a green-specification high refractive index transparent section and a blue-specification high refractive index transparent section,
a length h in the thickness direction of the high refractive index transparent sections satisfies: h='red wavelength'*(2*a+1)/{2*(n−n$_0$)} at the red-specification high refractive index transparent section; h='green wavelength'*(2*b+1)/{2*(n−n$_0$)} at the green-specification high refractive index transparent section; and h='blue wavelength'*(2*c+1)/{2*(n−n$_0$)} at the blue-specification high refractive index transparent section, where a, b and c are zero or integers greater than zero, and n, n$_0$ denote respectively refractive indices of the high refractive index transparent sections and the low refractive index transparent layer.

5. The imaging photodetection device according to claim 4, wherein a, b and c are zero or 1.

6. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a first specification high refractive index transparent section corresponding to a first wavelength and a second specification high refractive index transparent section corresponding to a second wavelength, which are different from each other in at least one of the refractive index, the shape and the size, and
the phase shift occurring between light passing through the high refractive index transparent sections and light passing through the low refractive index transparent layer is:
(a+½) times the first wavelength for the case of the first specification high refractive index transparent section and (b+½) times the second wavelength for the case of the second specification high refractive index transparent section, where a and b are zero or integers greater than zero.

7. The imaging photodetection device according to claim 6, wherein a and b are zero or 1.

8. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a first specification high refractive index transparent section corresponding to a first wavelength and a second specification high refractive index transparent section corresponding to a second wavelength, and
a length h in the thickness direction of the high refractive index transparent sections satisfies: h='first wavelength'*(2*a+1)/{2*(n-n_0)} at the first specification high refractive index transparent section; and h='second wavelength'*(2*b+1)/{2*(n-n_0)} at the second specification high refractive index transparent section, where a and b are zero or integers greater than zero, and n, $n_0$ denote respectively refractive indices of the high refractive index transparent sections and the low refractive index transparent layer.

9. The imaging photodetection device according to claim 8, wherein a and b are zero or 1.

10. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a red-specification high refractive index transparent section, a green-specification high refractive index transparent section, and a blue-specification high refractive index transparent section,
in a first direction parallel to a line established by the intersections of the $0^{th}$-order diffracted light, the $1^{st}$-order diffracted light and the $-1^{st}$-order diffracted light and with a surface of the substrate, a sequence of the red-specification high refractive index transparent section, the green-specification high refractive index transparent section and the blue-specification high refractive index transparent section, or a sequence of the red-specification high refractive index transparent section, the blue-specification high refractive index transparent section and the green-specification high refractive index transparent section is arranged repeatedly,
three of the photodetectors corresponding to each of the plural high refractive index transparent sections are arranged along the first direction, and
among the three photodetectors arranged along the first direction, two of the photodetectors positioned on both outsides also correspond to two of the high refractive index transparent sections that are adjacent in the first direction to the high refractive index transparent section corresponding to the three photodetectors.

11. The imaging photodetection device according to claim 10, wherein the positions in the first direction of the red-specification high refractive index transparent section, the green-specification high refractive index transparent section and the blue-specification high refractive index transparent section in the array of the plural high refractive index transparent sections arranged along the first direction are shifted by an arrangement pitch in the first direction between two of the arrays adjacent to each other in a second direction orthogonal to the first direction.

12. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the plural high refractive index transparent sections comprise a red-specification high refractive index transparent section, a green-specification high refractive index transparent section, and a blue-specification high refractive index transparent section,
in a first direction parallel to a line established by the intersections of the $0^{th}$-order diffracted light, the $1^{st}$-order diffracted light and the $-1^{st}$-order diffracted light and with a surface of the substrate, two of the red-specification high refractive index transparent section, the green-specification high refractive index transparent section and the blue-specification high refractive index transparent section are arranged alternately,
three of the photodetectors corresponding to each of the plural high refractive index transparent sections are arranged along the first direction, and
among the three photodetectors arranged along the first direction, two of the photodetectors positioned on both outsides also correspond to two of the high refractive index transparent sections that are adjacent in the first direction to the high refractive index transparent section corresponding to the three photodetectors.

13. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors;
at least two of the photodetectors correspond to one of the high refractive index transparent sections; and
light entering the low refractive index transparent layer and the high refractive index transparent sections passes therethrough to be separated into a $0^{th}$-order diffracted light, a $1^{st}$-order diffracted light and $-1^{st}$-order diffracted light by a phase shift occurring on the wavefront,
wherein the positions in a first direction of the high refractive index transparent sections in an array of the high refractive index transparent sections arranged along the first direction are shifted by a half of an arrangement pitch in the first direction from an adjacent array in a second direction orthogonal to the first direction, the first direction being parallel to a line by the intersections of the $0^{th}$-order diffracted light, the $1^{st}$-order diffracted light and the $-1^{st}$-order diffracted light with and a surface of the substrate.

14. An imaging photodetection device comprising: a plurality of photodetectors arrayed on a substrate one-dimensionally or two-dimensionally, a low refractive index transparent layer formed above the plural photodetectors, a plurality of columnar or plate-like high refractive index transparent sections embedded in the low refractive index transparent layer along the array direction of the plural photodetectors, and a lens array comprising a plurality of lenses positioned above the plural high refractive index transparent sections;
   at least two of the photodetectors correspond to one of the high refractive index transparent sections;
   the lenses of the lens array and the high refractive index transparent sections are in a one-to-one correspondence with each other in a cross section taken along an array direction of the plural high refractive index transparent sections; and
   light entering the low refractive index transparent layer and the high refractive index transparent sections is separated into a $0^{th}$-order diffracted light, a $1^{st}$-order diffracted light and $-1^{st}$-order diffracted light by a phase shift occurring on the wavefront due to passing of the light through the low refractive index transparent layer and the high refractive index transparent sections.

15. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors, wherein
the plural high refractive transparent sections comprise a first high refractive index transparent section and a second high refractive index transparent section, which are adjacent each other and different from each other in at least one of the refractive index, the shape and the size such that a phase shift due to passing of the light through the first high refractive index transparent section is different from a phase shift due to passing of the light through the second high refractive index transparent section.

16. An imaging photodetection device comprising:
a plurality of photodetectors arrayed on a substrate one-dimensionally or two-dimensionally, a low refractive index transparent layer formed above the plural photodetectors, and a plurality of columnar or plate-like high refractive index transparent sections embedded in the low refractive index transparent layer along the array direction of the plural photodetectors; wherein
light entering any one of the high refractive index transparent sections and the low refractive index transparent layer surrounding said any one of the high refractive index transparent sections is separated into a $0^{th}$-order diffracted light, a $1^{st}$-order diffracted light and $-1^{st}$ order diffracted light
wherein a diffracted light of one order entering one of the photodetectors corresponds to only a single high refractive index transparent section, and a diffracted light of an order different from said one order entering said one of the photodetectors corresponds to only one of the high refractive index transparent sections that is different from the one to which the first order diffracted light corresponds.

17. An imaging photodetection device comprising:
a substrate;
a plurality of photodetectors arrayed on the substrate, said plurality of photodetectors including a first photodetector, a second photodetector and a third photodetector;
a transparent layer having a first refractive index disposed above the plurality of photodetectors; and
a plurality of transparent sections having a second refractive index that is higher than the first refractive index, said plurality of transparent sections being embedded in the transparent layer along the array direction of the plurality of photodetectors, wherein
any one of the transparent sections and the transparent layer surrounding said any one of the transparent sections are configured to accept a light, separate the light into at least a $0^{th}$-order diffracted light, a $1^{st}$-order diffracted light and a $-1^{st}$-order diffracted light, and emit the $0^{th}$-order diffracted light, the $1^{st}$-order diffracted light and the $-1^{st}$-order diffracted light from the any one of the transparent sections and the transparent layer surrounding said any one of the transparent sections,
said first photodetector is configured to detect the $0^{th}$-order diffracted light,
said second photodetector is configured to detect the $1^{st}$-order diffracted light, and
said third photodetector is configured to detect the $-1^{st}$-order diffracted light.

18. An imaging photodetection device comprising:
a substrate;
a plurality of photodetectors arrayed on the substrate;
a transparent layer including a first refractive index disposed above the plurality of photodetectors; and
a plurality of transparent sections including a second refractive index that is higher than the first refractive index, the plurality of transparent sections including a first section and a second section adjacent to the first section, the first and the second section embedded in the transparent layer along the array direction of the plurality of photodetectors, wherein
said first section and the transparent layer surrounding said first section are configured to separate a light into at least a $0^{th}$-order diffracted light, a $1^{st}$-order diffracted light and a $-1^{st}$-order diffracted light,
said second section and the transparent layer surrounding said second section are configured to separate a light into at least a $0^{th}$-order diffracted light, a $1^{st}$-order diffracted light and a $-1^{st}$-order diffracted light, and
one photodetector of the plurality of the photodetectors is configured to detect any one of the $0^{th}$-order diffracted light, the $1^{st}$-order diffracted light and the $-1^{st}$-order diffracted light from first section and the transparent layer surrounding said first section, and configured to detect a different one of the $0^{th}$-order diffracted light, the $1^{st}$-order diffracted light and the $-1^{st}$-order diffracted light from the second section and the transparent layer surrounding the second section.

* * * * *